(12) United States Patent
Honjo

(10) Patent No.: US 11,394,064 B2
(45) Date of Patent: Jul. 19, 2022

(54) TEMPERATURE ADJUSTMENT CIRCUIT AND CONTROL METHOD THEREOF

(71) Applicant: HONDA MOTOR CO., LTD., Tokyo (JP)

(72) Inventor: Takuya Honjo, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 312 days.

(21) Appl. No.: 16/721,077

(22) Filed: Dec. 19, 2019

(65) Prior Publication Data

US 2020/0203787 A1 Jun. 25, 2020

(30) Foreign Application Priority Data

Dec. 21, 2018 (JP) .............................. JP2018-240233

(51) Int. Cl.
| | |
|---|---|
| H01M 10/63 | (2014.01) |
| H01M 10/6563 | (2014.01) |
| H05K 7/20 | (2006.01) |
| H01M 10/6568 | (2014.01) |

(52) U.S. Cl.
CPC ....... *H01M 10/63* (2015.04); *H01M 10/6563* (2015.04); *H01M 10/6568* (2015.04); *H05K 7/20918* (2013.01); *H05K 7/20936* (2013.01); *H05K 7/20945* (2013.01)

(58) Field of Classification Search
CPC ............. H01M 10/63; H01M 10/6563; H01M 10/6568; H05K 7/20; H05K 7/20936; H05K 7/20918
See application file for complete search history.

(56) References Cited

U.S. PATENT DOCUMENTS

2016/0107501 A1\* 4/2016 Johnston ............ B60H 1/00278
165/202

FOREIGN PATENT DOCUMENTS

| JP | 2010-007953 A | 1/2010 | |
|---|---|---|---|
| JP | 2013-188098 A | 9/2013 | |
| JP | 2013188098 A * | 9/2013 | .............. B60L 58/26 |
| JP | 2018-124021 A | 8/2018 | |

OTHER PUBLICATIONS

Sep. 29, 2020, Japanese Office Action issued for related JP application No. 2018-240233.

\* cited by examiner

*Primary Examiner* — Karie O'Neill Apicella
(74) *Attorney, Agent, or Firm* — Paratus Law Group, PLLC

(57) ABSTRACT

A temperature adjustment circuit includes a first pump that circulates a heat medium in at least one of a first temperature adjustment circuit and a second temperature adjustment circuit; a coupling path that couples the first temperature adjustment circuit and the second temperature adjustment circuit to form a coupled circuit; a switching unit capable of switching between a circulation state in which the heat medium circulates in the coupled circuit and a non-circulation state in which the heat medium does not circulate in the coupled circuit; and a control device that controls the switching unit and the first pump. The control device switches the coupled circuit from the non-circulation state to the circulation state in a state in which a rotation speed of the first pump is decreased lower than a rotation speed of the first pump before switching, and increases the rotation speed of the first pump after switching.

8 Claims, 13 Drawing Sheets

TEMPERATURE ADJUSTMENT CIRCUIT AND CONTROL METHOD THEREOF

CROSS-REFERENCE TO RELATED APPLICATIONS

This application is based on and claims priority under 35 USC 119 from Japanese Patent Application No. 2018-240233 filed on Dec. 21, 2018.

TECHNICAL FIELD

The present invention relates to a temperature adjustment circuit for adjusting a temperature of a battery or the like, and a control method thereof.

BACKGROUND ART

There has been a temperature adjustment circuit for an electric vehicle including: a first temperature adjustment circuit; a second temperature adjustment circuit; a pump that circulates a heat medium to at least one of the first temperature adjustment circuit and the second temperature adjustment circuit; a coupling path that couples the first temperature adjustment circuit and the second temperature adjustment circuit to form a coupled circuit; and a switching unit capable of switching between a circulation state in which the heat medium circulates in the coupled circuit and a non-circulation state in which the heat medium does not circulate in the coupled circuit.

For example, JP-A-2013-188098 discloses a temperature adjustment circuit including: a cooling circuit that cools a battery; a cooling circuit that cools an inverter; a first refrigerant pump provided in the cooling circuit that cools a battery; a second refrigerant pump provided in the cooling circuit that cools an inverter; and a switching valve that switches between a state in which the battery and the inverter are subjected to temperature adjustment in the same circuit (hereinafter, also referred to as a circulation state) and a state in which the battery and the inverter are subjected to temperature adjustment in separate circuits (hereinafter, also referred to as a non-circulation state), in which the temperature adjustment circuit is set to the circulation state in a case where an outside air temperature is lower than a predetermined temperature, and is set to the non-circulation state in a case where the outside air temperature is equal to or higher than the predetermined temperature, so as to raise an accuracy of temperature adjustment.

However, in the temperature adjustment circuit disclosed in JP-A-2013-188098, when the coupled circuit is switched from the non-circulation state to the circulation state, an excessive load may be applied on a movable portion of the switching unit. Therefore, a thrust required for operation of the switching unit increases, and an increase in size or in manufacturing cost of the switching unit becomes a problem.

SUMMARY

An aspect of the present invention provides a temperature adjustment circuit and a control method thereof that are capable of preventing increase in size or manufacturing cost of a switching unit.

An embodiment of the present invention relates to a temperature adjustment circuit which includes:
a first temperature adjustment circuit configured to exchange heat with a battery;
a second temperature adjustment circuit configured to exchange heat with at least one of a motor and a power conversion device that supplies electric power to the motor;
a first pump configured to circulate a heat medium in at least one of the first temperature adjustment circuit and the second temperature adjustment circuit;
a coupling path that couples the first temperature adjustment circuit and the second temperature adjustment circuit to form a coupled circuit;
a switching unit capable of switching between a circulation state in which the heat medium circulates in the coupled circuit and a non-circulation state in which the heat medium does not circulate in the coupled circuit; and
a control device configured to control the switching unit and the first pump,
when the control device switches the coupled circuit from the non-circulation state to the circulation state, the control device performs switching of the switching unit in a state in which a rotation speed of the first pump is decreased lower than a rotation speed of the first pump before switching, and increases the rotation speed of the first pump after switching.

Another embodiment of the present invention relates to a control method for a temperature adjustment circuit which includes:
a first temperature adjustment circuit configured to exchange heat with a battery;
a second temperature adjustment circuit configured to exchange heat with at least one of a motor and a power conversion device that supplies electric power to the motor;
a first pump configured to circulate a heat medium in at least one of the first temperature adjustment circuit and the second temperature adjustment circuit;
a coupling path that couples the first temperature adjustment circuit and the second temperature adjustment circuit to form a coupled circuit; and
a switching unit capable of switching between a circulation state in which the heat medium circulates in the coupled circuit and a non-circulation state in which the heat medium does not circulate in the coupled circuit,
in which the control method includes:
when the coupled circuit is switched from the non-circulation state to the circulation state, performing switching of the switching unit in a state in which a rotation speed of the first pump is decreased lower than a rotation speed of the first pump before switching; and
increasing the rotation speed of the first pump after switching Another embodiment of the present invention relates to a temperature adjustment circuit which includes:
a first temperature adjustment circuit configured to exchange heat with a battery;
a second temperature adjustment circuit configured to exchange heat with at least one of a motor and a power conversion device that supplies electric power to the motor;
a pump configured to circulate a heat medium in at least one of the first temperature adjustment circuit and the second temperature adjustment circuit;
a coupling path that couples the first temperature adjustment circuit and the second temperature adjustment circuit to form a coupled circuit;
a switching unit capable of switching between a circulation state in which the heat medium circulates in the coupled circuit and a non-circulation state in which the heat medium does not circulate in the coupled circuit; and
a control device configured to control the switching unit and the pump, in which the temperature adjustment circuit further includes:
  a branch path configured to bypass the switching unit and connect the first temperature adjustment circuit and the second temperature adjustment circuit; and
  an electromagnetic valve disposed in the branch path and configured to switch opening and closing of the branch path, and
in which when the control device switches the coupled circuit from the non-circulation state to the circulation state, the control device controls the electromagnetic valve from a closed state to an open state.

According to the above embodiments of the present invention, when the coupled circuit is switched from the non-circulation state to the circulation state, it is possible to prevent a thrust required for operation of a movable portion of the switching unit from increasing, thereby preventing increase in size or increase in manufacturing cost of the switching unit.

DESCRIPTION OF EMBODIMENTS

First Embodiment

First, a first embodiment of the present invention will be described with reference to FIGS. 1 to 8.

[Temperature Adjustment Circuit]

Figure 1:
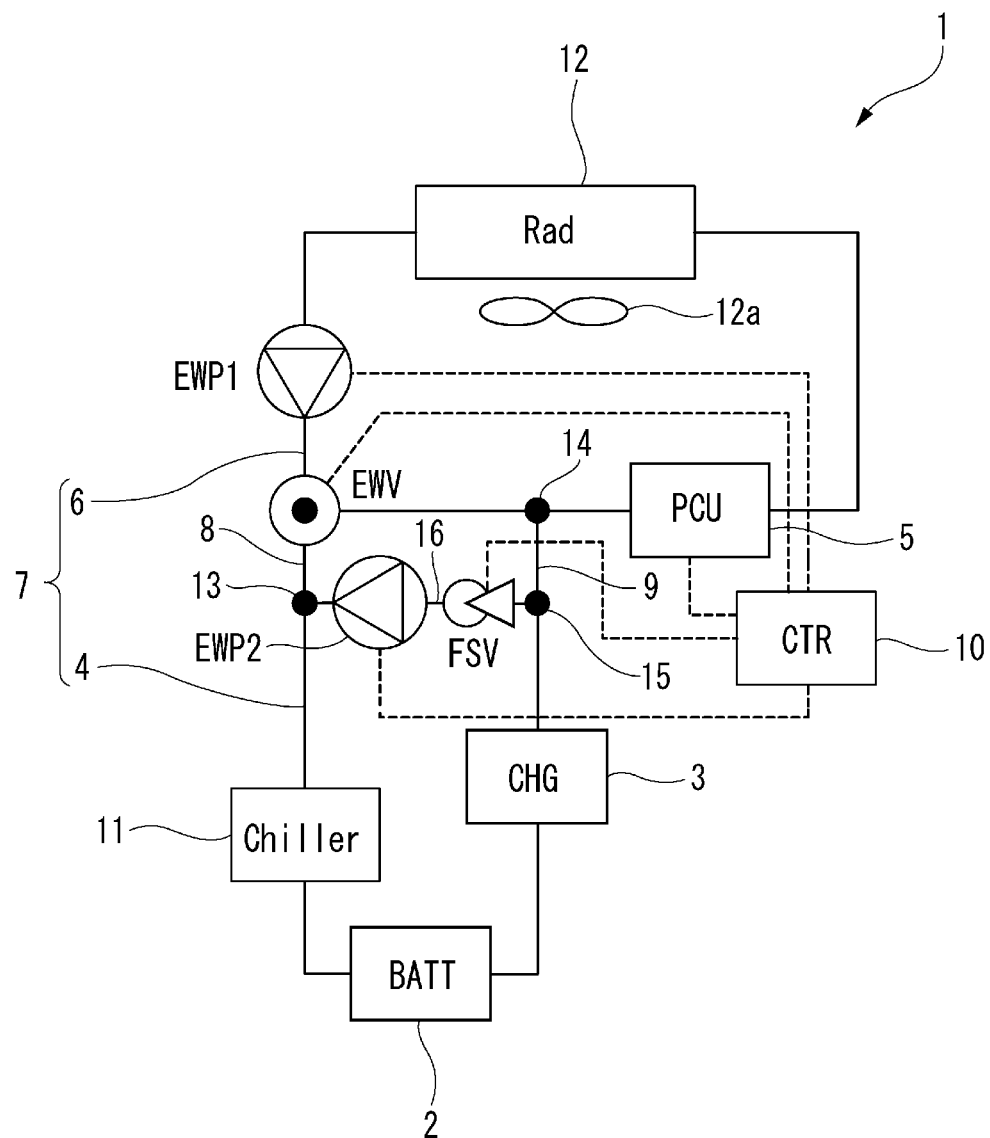
FIG. 1 is a circuit diagram showing a configuration of a temperature adjustment circuit according to a first embodiment of the present invention.

As shown in FIG. 1, a temperature adjustment circuit 1 for an electric vehicle includes: a first temperature adjustment circuit 4 that exchanges heat with a battery 2 and a charger 3; a second temperature adjustment circuit 6 that exchanges heat with a power conversion device (power control unit) 5 that supplies electric power to a motor 105 (see FIG. 13); coupling paths 8, 9 that couple the first temperature adjustment circuit 4 and the second temperature adjustment circuit 6 to form a coupled circuit 7; an electromagnetic switching valve EWV capable of switching between a series mode (circulation state) in which a heat medium circulates in the coupled circuit 7 and a separate mode (non-circulation state) in which the heat medium circulates in the separate temperature adjustment circuits 4, 6 without circulating in the coupled circuit 7; and a control device 10 that controls the electromagnetic switching valve EWV and the like. The heat medium is a liquid medium such as water, a radiator liquid, or a coolant liquid.

[First Temperature Adjustment Circuit]

The first temperature adjustment circuit 4 includes: a second pump EWP2 that circulates the heat medium in the circuit; a chiller 11 that is disposed downstream of the second pump EWP2 and performs heat exchange using an air conditioning circuit of the electric vehicle; a battery 2 and a charger 3 that are disposed downstream of the chiller 11; and an electromagnetic open-close valve FSV disposed downstream of the charger 3 and upstream of the second pump EWP2.

Figure 2:
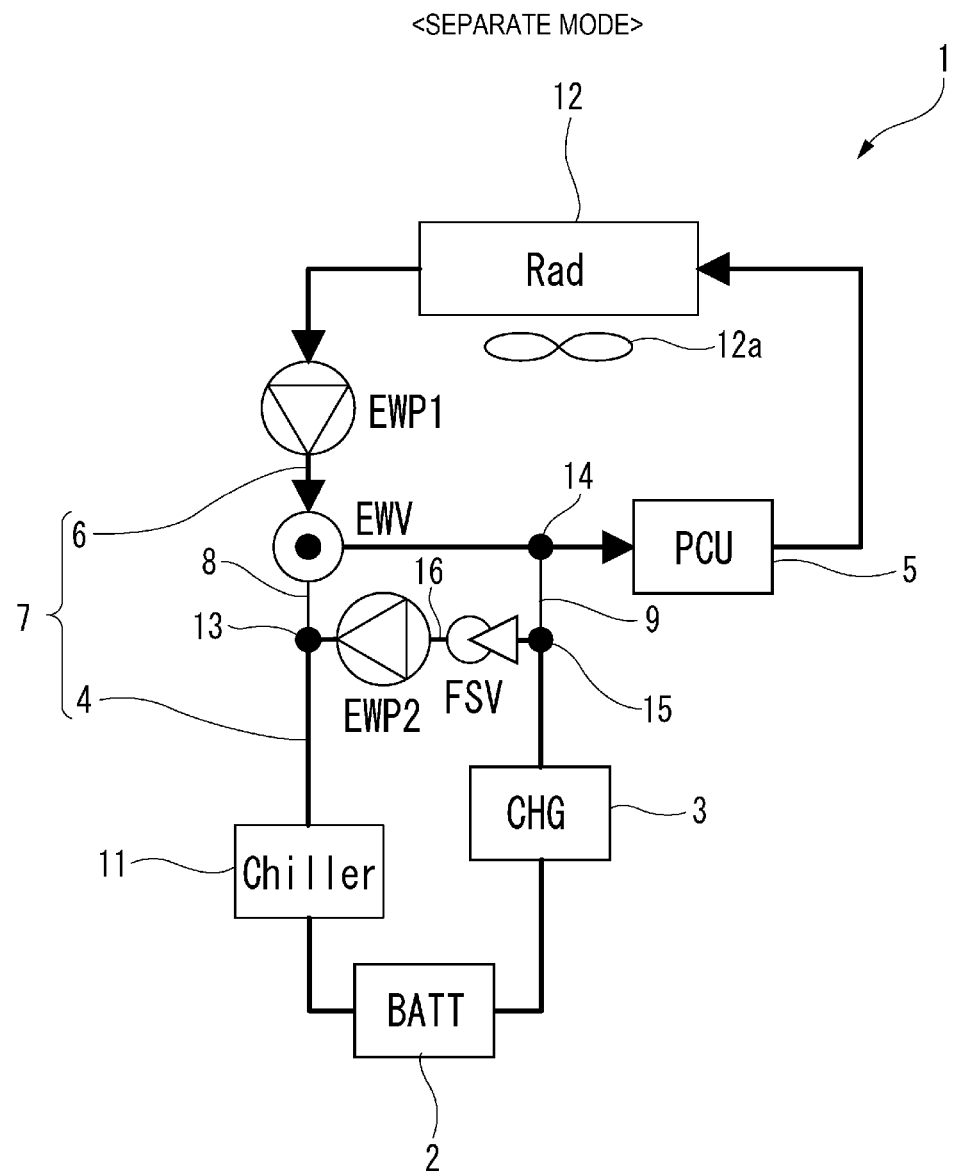
FIG. 2 is an explanatory view showing a flow of a heat medium in a separate mode in the temperature adjustment circuit of FIG. 1.

As shown in FIG. 2, in the separate mode, by driving the second pump EWP2 in the open state of the electromagnetic open-close valve FSV, the heat medium discharged from the second pump EWP2 can be circulated in the order of the chiller 11, the battery 2, and the charger 3. As a result, the heat medium cooled by the chiller 11 exchanges heat with the battery 2 and the charger 3, and the battery 2 and the charger 3 are cooled appropriately.

[Second Temperature Adjustment Circuit]

The second temperature adjustment circuit 6 includes: a first pump EWP1 that circulates the heat medium in the circuit; an electromagnetic switching valve EWV that is disposed downstream of the first pump EWP1 and switches between the separate mode and the series mode; a power conversion device 5 disposed downstream of the electromagnetic switching valve EWV; a radiator 12 that is disposed downstream of the power conversion device 5 and cools the heat medium; and a fan 12a that blows air to the radiator 12. The power conversion device 5 includes at least one of: an inverter that converts DC power into AC power and converts AC power into DC power; and a DC-DC converter that steps up or steps down a DC voltage.

Figure 4:
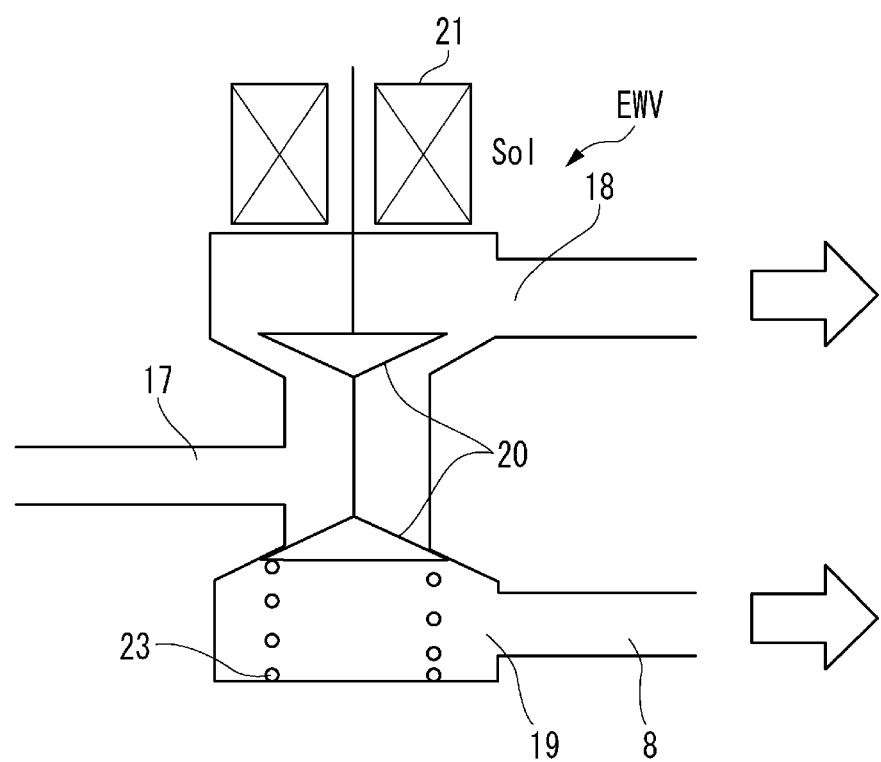
FIG. 4 is an explanatory view showing a schematic configuration of an electromagnetic switching valve provided in the temperature adjustment circuit of FIG. 1.

As shown in FIG. 4, the electromagnetic switching valve EWV of the present embodiment is an electromagnetic three-way valve, and includes: a first port 17 connected downstream of the first pump EWP1; a second port 18 connected upstream of the power conversion device 5; a third port 19 connected to a side of the first coupling path 8, which will be described later; a valve body 20 that is a movable body that switches a flow path; a spring 23 that biases the valve body 20 to a first position (a position in FIG. 4); and an electromagnet 21 that switches the position of the valve body 20 to a second position against a biasing force of the spring 23.

In the separate mode, the electromagnet 21 of the electromagnetic switching valve EWV is not energized, and the valve body 20 is in the first position. At this time, the electromagnetic switching valve EWV allows connection between a downstream flow path of the first pump EWP1

(the first port 17) and an upstream flow path of the power conversion device 5 (the second port 18), and blocks connection between the downstream side flow path of the first pump EWP1 (the first port 17) and the first coupling path 8 (the third port 19) described later. In the separate mode, as shown in FIG. 2, by driving the first pump EWP1, the heat medium discharged from the first pump EWP1 can be circulated in the order of the power conversion device 5 and the radiator 12. As a result, the heat medium cooled by the radiator 12 exchanges heat with the power conversion device 5, and the power conversion device 5 is cooled appropriately.

On the other hand, in the series mode, the electromagnet 21 of the electromagnetic switching valve EWV is energized, and the position of the valve body 20 is switched from the first position to the second position. At this time, the electromagnetic switching valve EWV blocks connection between a downstream flow path of the first pump EWP1 (the first port 17) and an upstream flow path of the power conversion device 5 (the second port 18), and allows connection between the downstream side flow path of the first pump EWP1 (the first port 17) and the first coupling path 8 (the third port 19) described later. Flow of the heat medium and the refrigerant in the series mode will be described later.

[Coupled Circuit]

The coupling paths 8, 9 include the first coupling path 8 and the second coupling path 9. The first coupling path 8 couples the third port 19 of the electromagnetic switching valve EWV of the second temperature adjustment circuit 6 and the third connection portion 13 of the first temperature adjustment circuit 4, and the second coupling path 9 couples the first connection portion 14 of the second temperature adjustment circuit 6 and the second connection portion 15 of the first temperature adjustment circuit 4. The first connection portion 14 is located downstream of the electromagnetic switching valve EWV in the second temperature adjustment circuit 6 and upstream of the power conversion device 5, the third connection unit 13 is located downstream of the second pump EWP2 in the first temperature adjustment circuit 4 and upstream of the chiller 11, and the second connection portion 15 is located downstream of the charger 3 in the first temperature adjustment circuit 4 and upstream of the electromagnetic open-close valve FSV. That is, the third connection portion 13 is disposed upstream of the second connection portion 15 when viewed from the second pump EWP2 in the first temperature adjustment circuit 4.

A path between the third connection portion 13 and the second connection portion 15 in the first temperature adjustment circuit 4, that is, a path in which the second pump EWP2 and the electromagnetic open-close valve FSV in the first temperature adjustment circuit 4 are arranged, functions as a branch path 16 that bypasses a portion of the coupled circuit 7.

Figure 3:
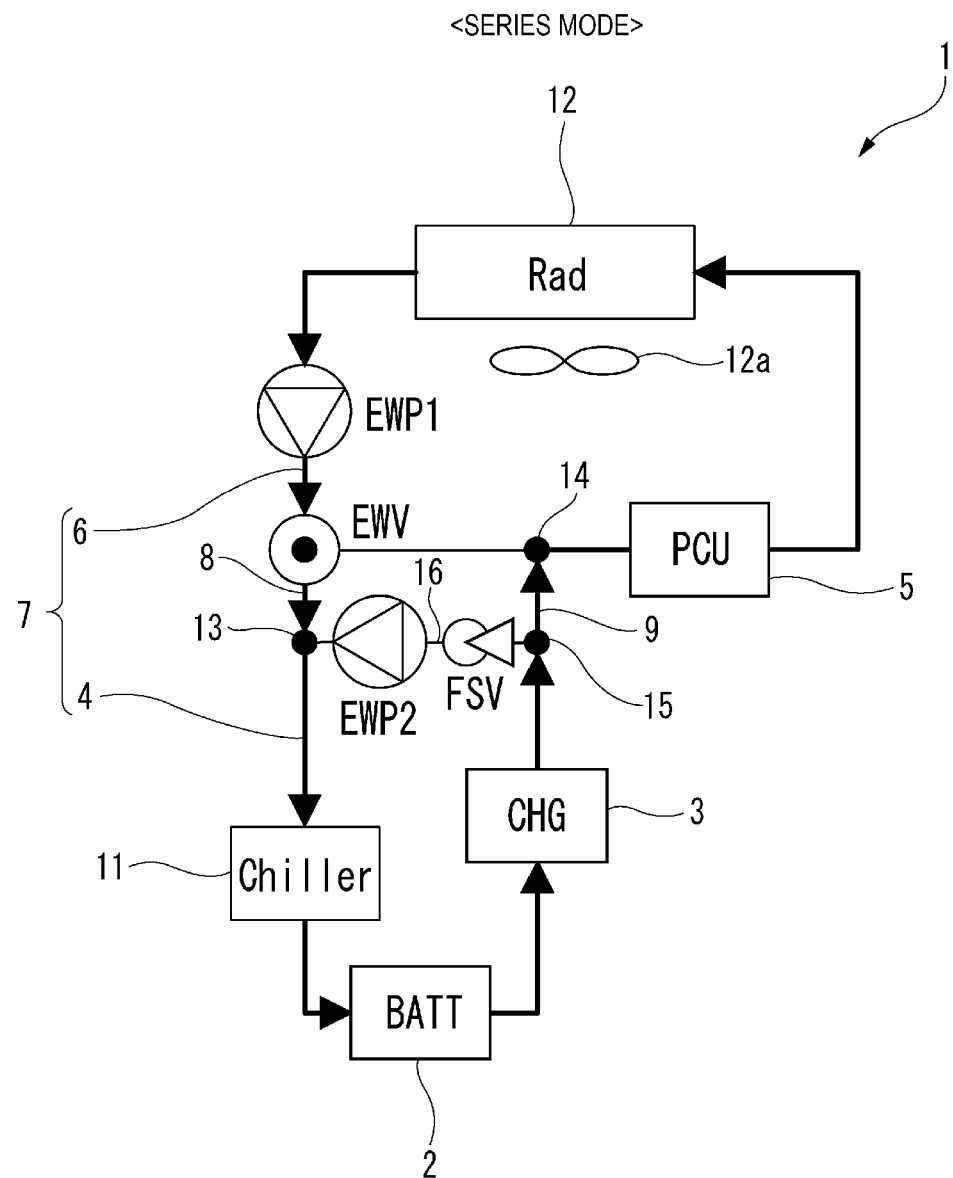
FIG. 3 is an explanatory view showing a flow of a heat medium in a series mode in the temperature adjustment circuit of FIG. 1.

As shown in FIG. 3, in the series mode in which the heat medium circulates in the coupled circuit 7, the second pump EWP2 is stopped, and the heat medium is circulated by driving the first pump EWP1. As a result, the heat medium discharged from the first pump EWP1 circulates in the order of the chiller 11, the battery 2, the charger 3, the power conversion device 5, and the radiator 12, and the battery 2, the charger 3, and the power conversion device 5 are cooled. In the series mode, the electromagnetic open-close valve FSV is closed to stop circulation of the heat medium via the branch path 16.

[Control Device]

The control device 10 inputs temperature information of the battery 2, the power conversion device 5, and the outside air, and rotation speed information of the first pump EWP1 and the second pump EWP2, and controls the first pump EWP1, the second pump EWP2, the electromagnetic switching valve EWV, the electromagnetic open-close valve FSV, and the fan 12a based on determination according to the input information, so as to appropriately operate the temperature adjustment circuit 1.

When the control device 10 switches the temperature adjustment circuit 1 from the separate mode to the series mode, the control device 10 performs switching of the electromagnetic switching valve EWV in a state in which the rotation speed of the first pump EWP1 is decreased lower than the rotation speed of the first pump EWP1 before switching, and increases the rotation speed of the first pump EWP1 after switching.

[First Control Example]

Next, a specific control procedure of the control device 10 and operation of the temperature adjustment circuit 1 accompanying the control procedure will be described with reference to FIGS. 5 and 6.

Figure 5:
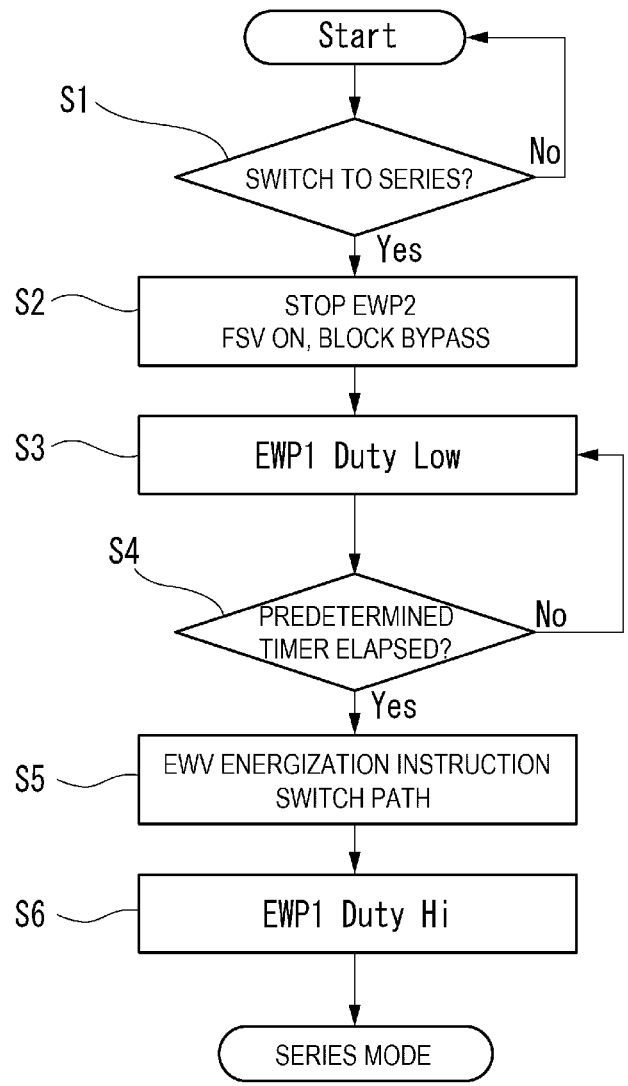
FIG. 5 is a flowchart showing a first control example of the temperature adjustment circuit of FIG. 1.
Figure 6:
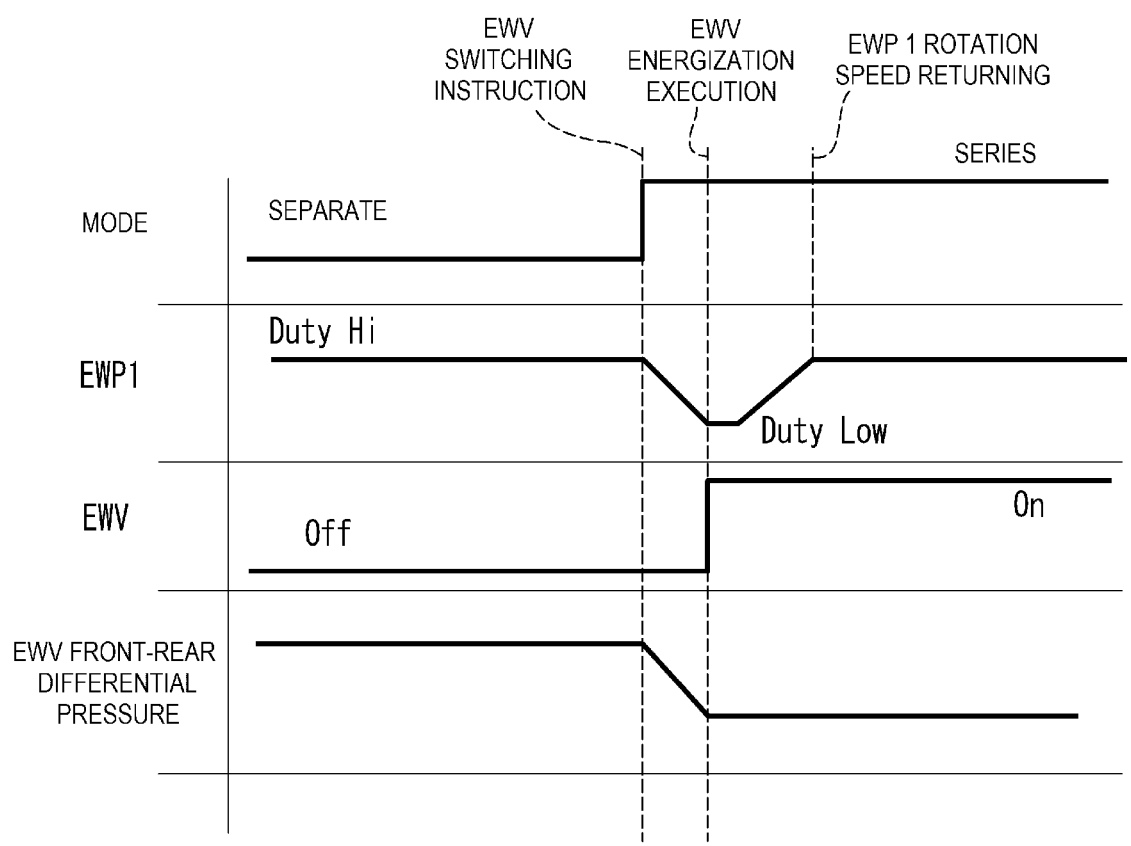
FIG. 6 is a timing chart showing operation of the temperature adjustment circuit according to the control example of FIG. 5.

As shown in FIG. 5, when in the separate mode, the control device 10 repeatedly determines switching to the series mode (Si of FIG. 5). In a case where a determination result thereof is YES, the control device 10 performs stop instruction of the second pump EWP2 and close instruction of the electromagnetic open-close valve FSV (S2 in FIG. 5). Subsequently, the control device 10 outputs a control instruction (Duty Low) for decreasing the rotation speed of the first pump EWP1 lower than the rotation speed of the first pump EWP1 before switching (S3 of FIG. 5, EWV switching instruction of FIG. 6), and waits until a timer time required to decrease the rotation speed of the first pump EWP1 has elapsed (S4 in FIG. 5). When the control device 10 determines that the timer time has elapsed, the control device 10 instructs energization to the electromagnetic switching valve EWV to switch the circuit (S5 in FIG. 5, EWV energization execution in FIG. 6), and shifts to the series mode. When the control device 10 shifts to the series mode, the control device 10 outputs a control instruction for returning the rotation speed of the first pump EWP1 to the original number (Duty Hi) (S6 in FIG. 5), so as to return the rotation speed of the first pump EWP1 to the rotation speed of the first pump EWP1 before switching (EWV rotation speed returning in FIG. 6).

According to the control procedure of the control device 10, when the control device 10 switches the temperature adjustment circuit 1 from the separate mode to the series mode, the control device 10 performs switching of the electromagnetic switching valve EWV in a state in which the rotation speed of the first pump EWP1 is decreased lower than the rotation speed of the first pump EWP1 before switching, and increases the rotation speed of the first pump EWP1 after switching. Therefore, as shown in FIG. 6, it is possible to decrease a front-rear differential pressure of the electromagnetic switching valve EWV when switching the electromagnetic switching valve EWV, and to prevent the thrust required for operation of the movable portion of the electromagnetic switching valve EWV from increasing.

The control device 10 can stably switch the circuit by switching the temperature adjustment circuit 1 from the separate mode to the series mode after the electromagnetic open-close valve FSV is controlled from the open state to the closed state.

[Second Control Example]

Next, a second control example of the temperature adjustment circuit 1 performed by the control device 10 will be described with reference to FIGS. 7 and 8.

A second control example of the temperature adjustment circuit 1 performed by the control device 10 is different from the first control example in that when the temperature adjustment circuit 1 is switched from the separate mode to the series mode, the air volume of the fan 12a that blows air to the radiator 12 is increased.

That is, when the control device 10 switches the temperature adjustment circuit 1 from the separate mode to the series mode, the control device 10 increases the air volume of the fan 12a that blow air to the radiator 12 when decreasing the rotation speed of the first pump EWP1 lower than the rotation speed of the first pump EWP1 before switching, thereby preventing decrease in heat radiation performance even when a flow rate of the heat medium decreases.

Figure 7:
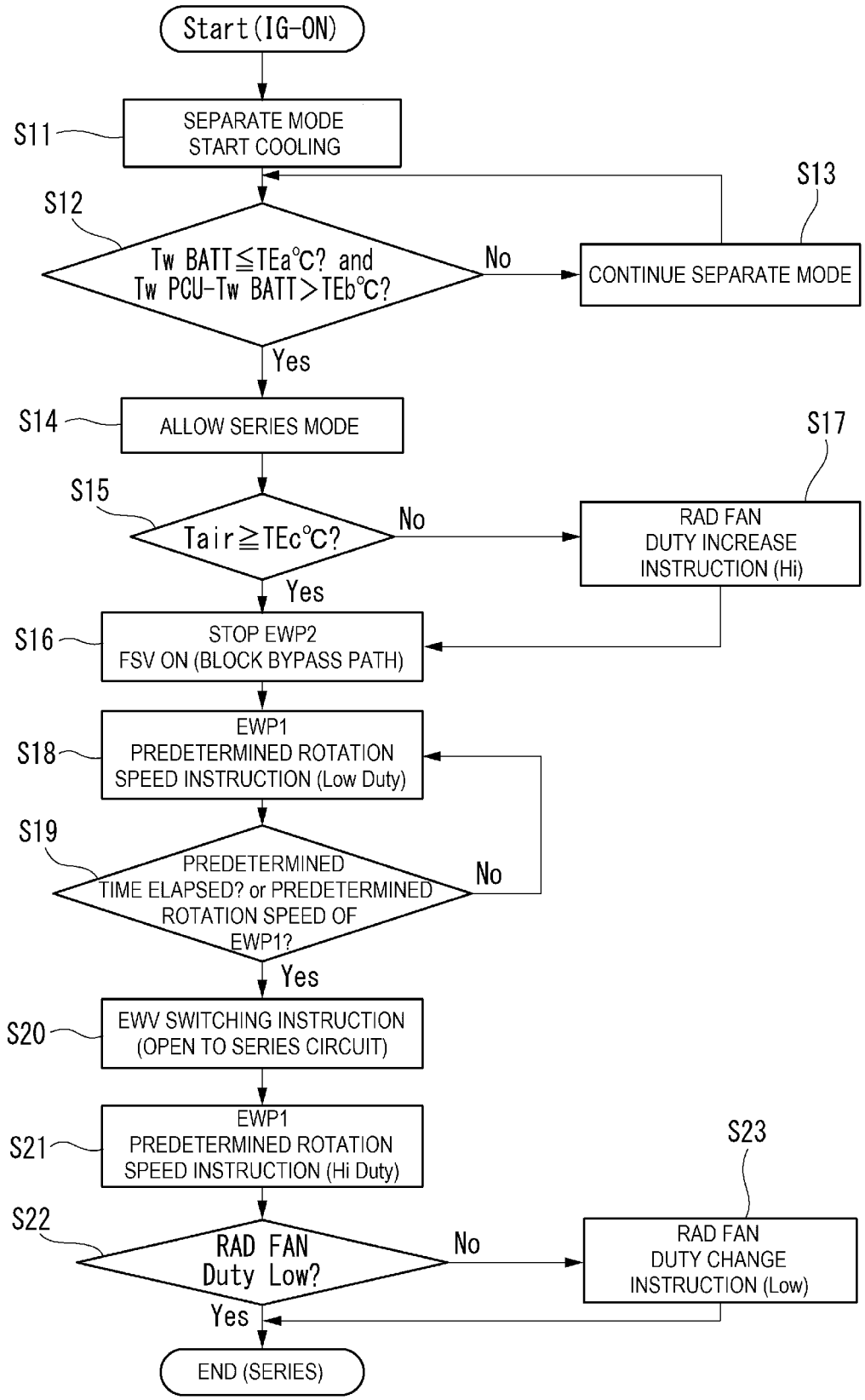
FIG. 7 is a flowchart showing a second control example of the temperature adjustment circuit of FIG. 1.

Specifically, when the control device 10 starts the control procedure shown in FIG. 7 after an ignition switch of the electric vehicle is turned on, first, the control device 10 starts cooling the battery 2, the charger 3, and the power conversion device 5 in the separate mode (S11 of FIG. 7). Here, the control device 10 drives the first pump EWP1 and the second pump EWP2 with the electromagnetic switching valve EWV switched to the separate mode side (energization off) and with the electromagnetic open-close valve set to the open state (energization off), so as to operate the temperature adjustment circuit 1 in the separate mode.

Next, the control device 10 determines continuation of the separate mode and shift to the series mode based on the temperature information of the battery 2 and the power conversion device 5 (S12 in FIG. 7). Here, the control device 10 determines whether or not a temperature of the battery 2 (Tw BATT) is equal to or lower than TEa° C. (for example, 35° C. to 50° C.) or whether or not a difference between a temperature of the power conversion device 5 and the temperature of the battery 2 (Tw PCU−Tw BATT) is greater than TEb° C. (for example, 5° C. to 10° C.), continues the separate mode in a case where both determination results thereof are NO (S13 in FIG. 7), and allows shift to the series mode when determining that either one of the determination results is YES (S14 in FIG. 7).

When the control device 10 determines to shift to the series mode, first, the control device 10 determines whether or not an outside air temperature (Tair) is equal to or higher than TEc° C. (for example, 25° C. to 30° C.) (S15 in FIG. 7), performs stop instruction of the second pump EWP2 and valve closing instruction of the electromagnetic open-close valve FSV (S16 in FIG. 7) in a case where a determination result thereof is YES, and performs instruction for increasing the rotation speed of the fan 12a that blows air to the radiator 12 (Duty Hi) (S17 in FIG. 7) and then performs stop instruction of the second pump EWP2 and valve closing instruction of the electromagnetic open-close valve FSV (S16 in FIG. 7) in a case where the determination result thereof is NO. That is, when the control device 10 switches the temperature adjustment circuit 1 from the separate mode to the series mode, the control device 10 increases the rotation speed of the fan 12a so as to increase the air volume of the fan 12a that blows air to the radiator 12 before decreasing the rotation speed of the first pump EWP1 lower than the rotation speed of the first pump EWP1 before switching. However, in a situation that the outside air temperature is high, since improvement of heat radiation performance cannot be expected even by increasing the rotation speed of the fan 12a, the process of increasing the rotation speed of the fan 12a is omitted.

Figure 8:
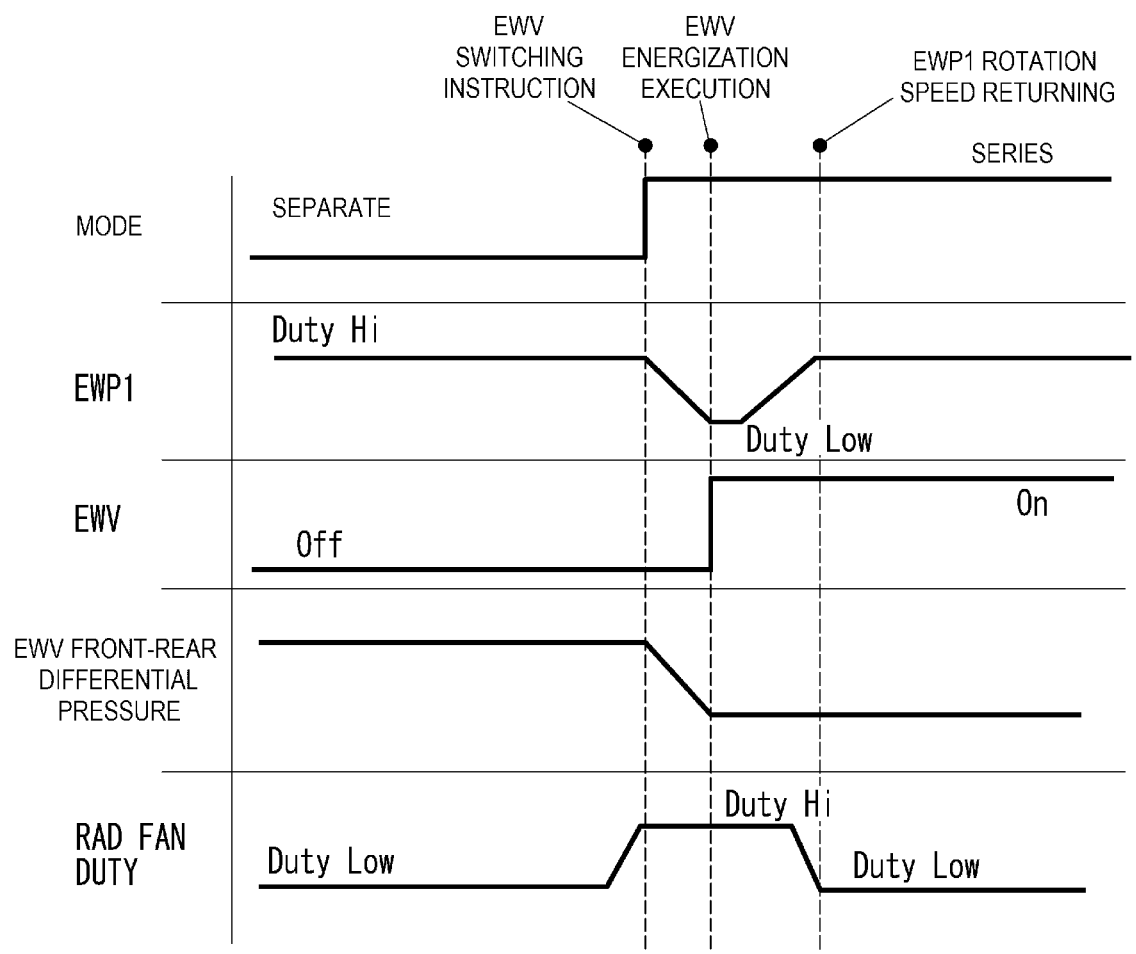
FIG. 8 is a timing chart showing operation of the temperature adjustment circuit according to the control example of FIG. 7.

Next, the control device 10 performs instruction for decreasing the rotation speed of the first pump EWP1 to a predetermined rotation speed (Duty Low) (S18 of FIG. 7, EWV switching instruction in FIG. 8). Here, the control device 10 decreases the rotation speed of the first pump EWP1 (S18 in FIG. 7) while repeatedly determining whether or not the rotation speed of the first pump EWP1 is decreased to the predetermined rotation speed (Duty Low) or not or whether or not the predetermined time has elapsed (S19 in FIG. 7), and, when both determination results become YES, switch the electromagnetic switching valve EWV to the series mode side (energization ON) (S20 in FIG. 7, EWV energization execution in FIG. 8).

Then, the control device 10 performs instruction for returning the rotation speed of the first pump EWP1 to the rotation speed during normal operation (Duty Hi) (S21 in FIG. 7), determines whether or not the rotation speed of the fan 12a is the rotation speed during normal operation (Duty Low) (S22 in FIG. 7), and performs instruction for returning the rotation speed of the fan 12a to the rotation speed during normal operation (Duty Low) in a case where a determination result thereof is NO (S23 in FIG. 7).

According to the control procedure of the control device 10, when the control device 10 switches the temperature adjustment circuit 1 from the separate mode to the series mode, the control device 10 performs switching of the electromagnetic switching valve EWV in a state in which the rotation speed of the first pump EWP1 is decreased lower than the rotation speed of the first pump EWP1 before switching, and increases the rotation speed of the first pump EWP1 after switching. Therefore, as shown in FIG. 8, it is possible to decrease a differential pressure of the electromagnetic switching valve EWV before and after switching the electromagnetic switching valve EWV, and to prevent the thrust required for operation of the movable portion of the electromagnetic switching valve EWV from increasing. Further, the control device 10 increases the air volume of the fan 12a that blow air to the radiator 12 when decreasing the rotation speed of the first pump EWP1 lower than the rotation speed of the first pump EWP1 before switching, thereby preventing decrease in heat radiation performance even when a flow rate of the heat medium decreases.

Second Embodiment

Next, a temperature adjustment circuit 1B according to a second embodiment of the present invention will be described with reference to FIGS. 9 to 12. For the configuration in common with the first embodiment described above, the description of the first embodiment is cited by using the same reference numerals as those of the first embodiment.

Figure 9:
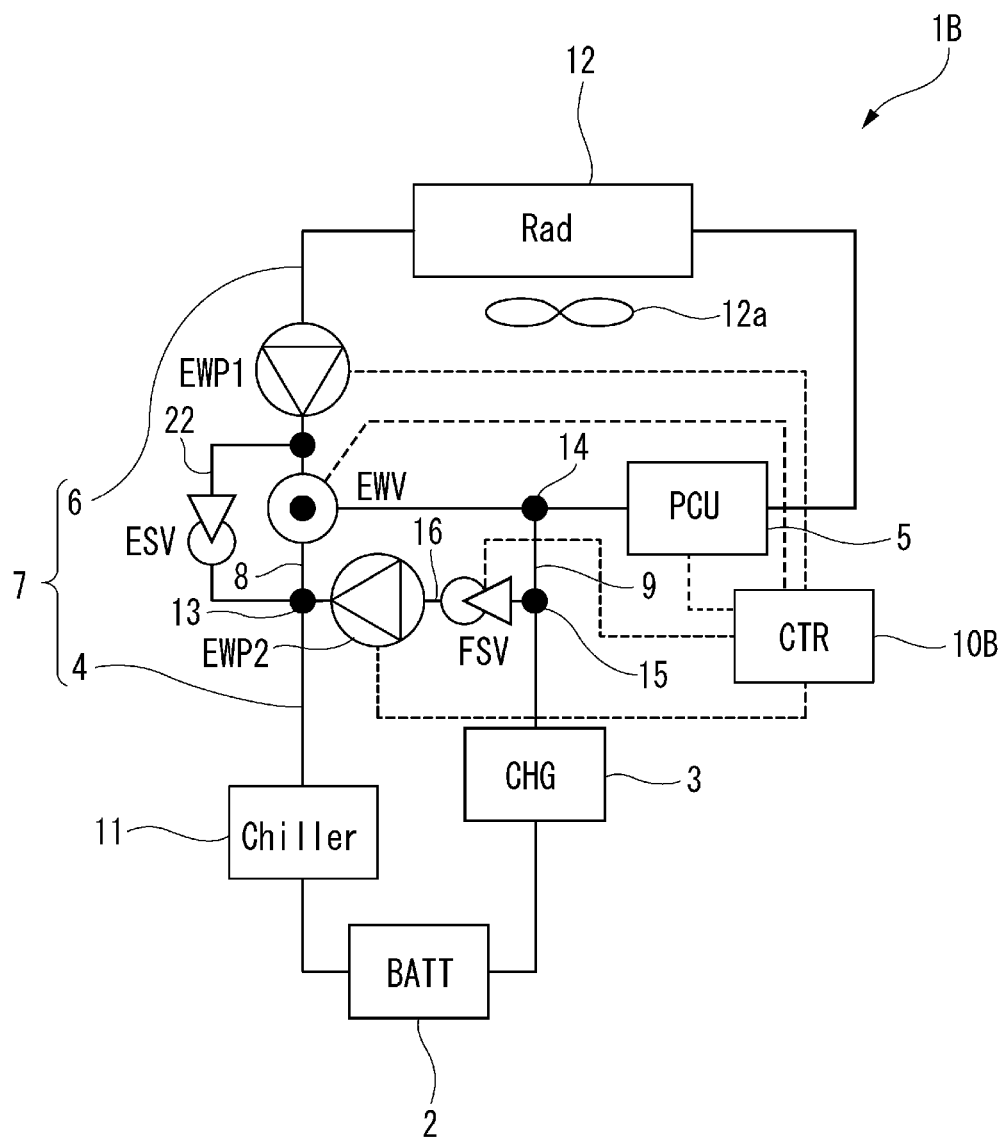
FIG. 9 is a circuit diagram showing a configuration of a temperature adjustment circuit according to a second embodiment of the present invention.
Figure 10:
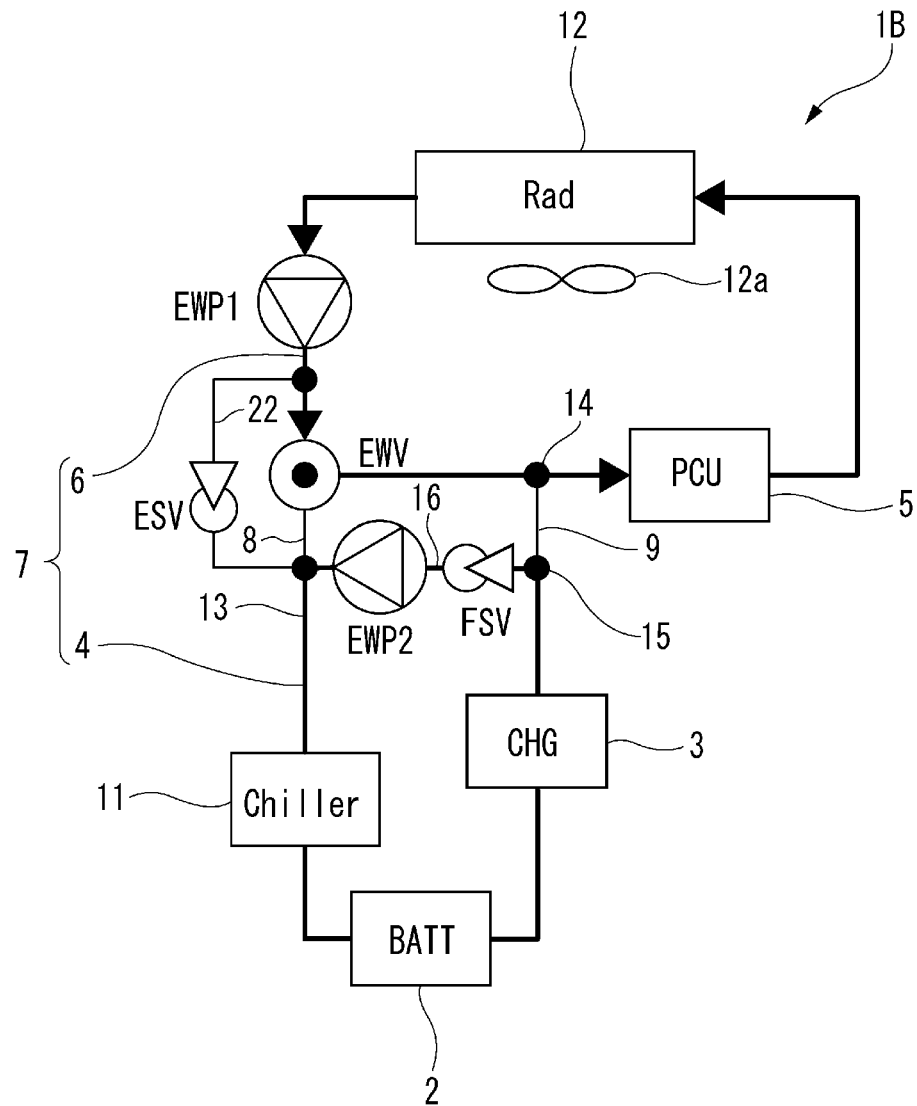
FIG. 10 is an explanatory view showing a flow of a heat medium in a separate mode in the temperature adjustment circuit of FIG. 9.
Figure 11:
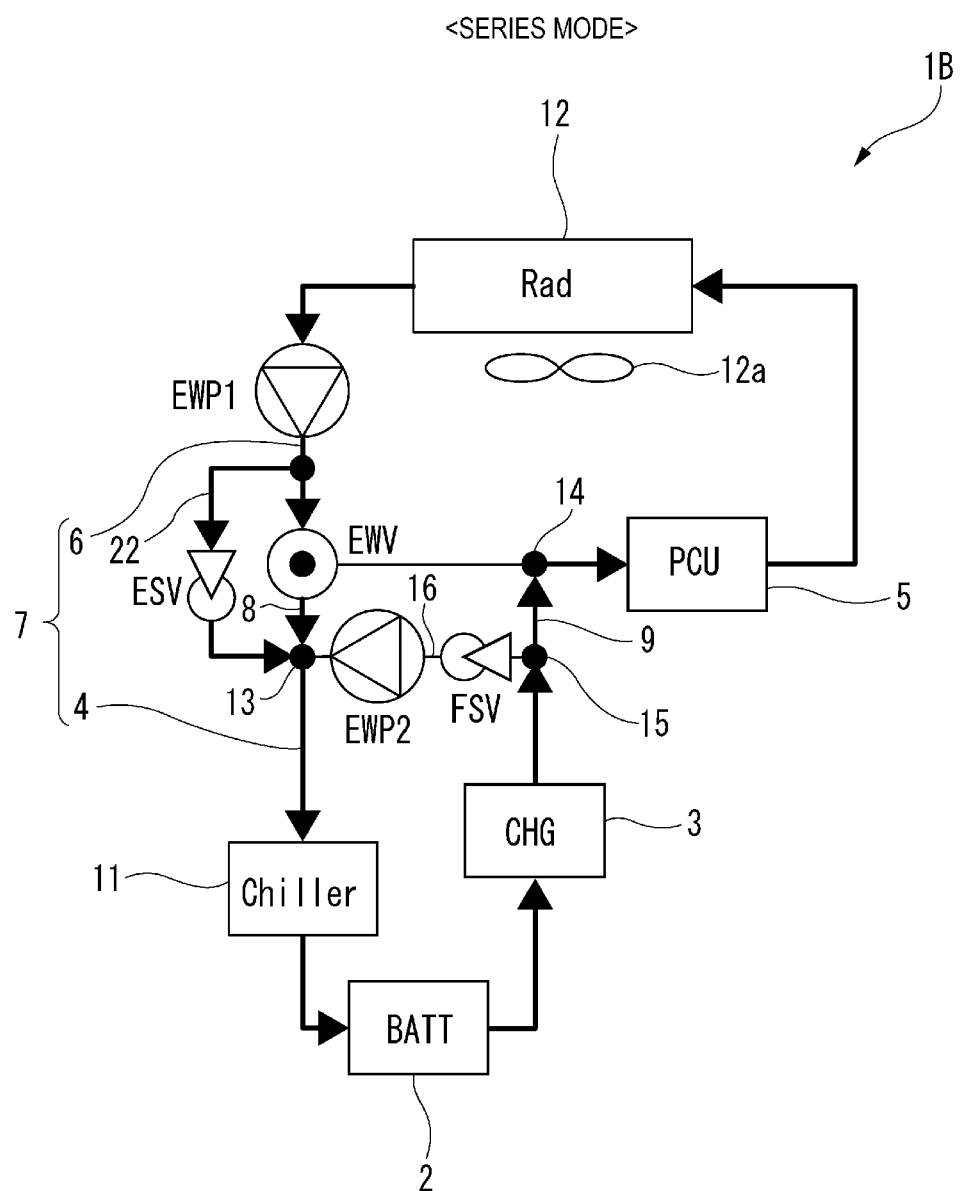
FIG. 11 is an explanatory view showing a flow of a heat medium in a series mode in the temperature adjustment circuit of FIG. 9.
Figure 12:
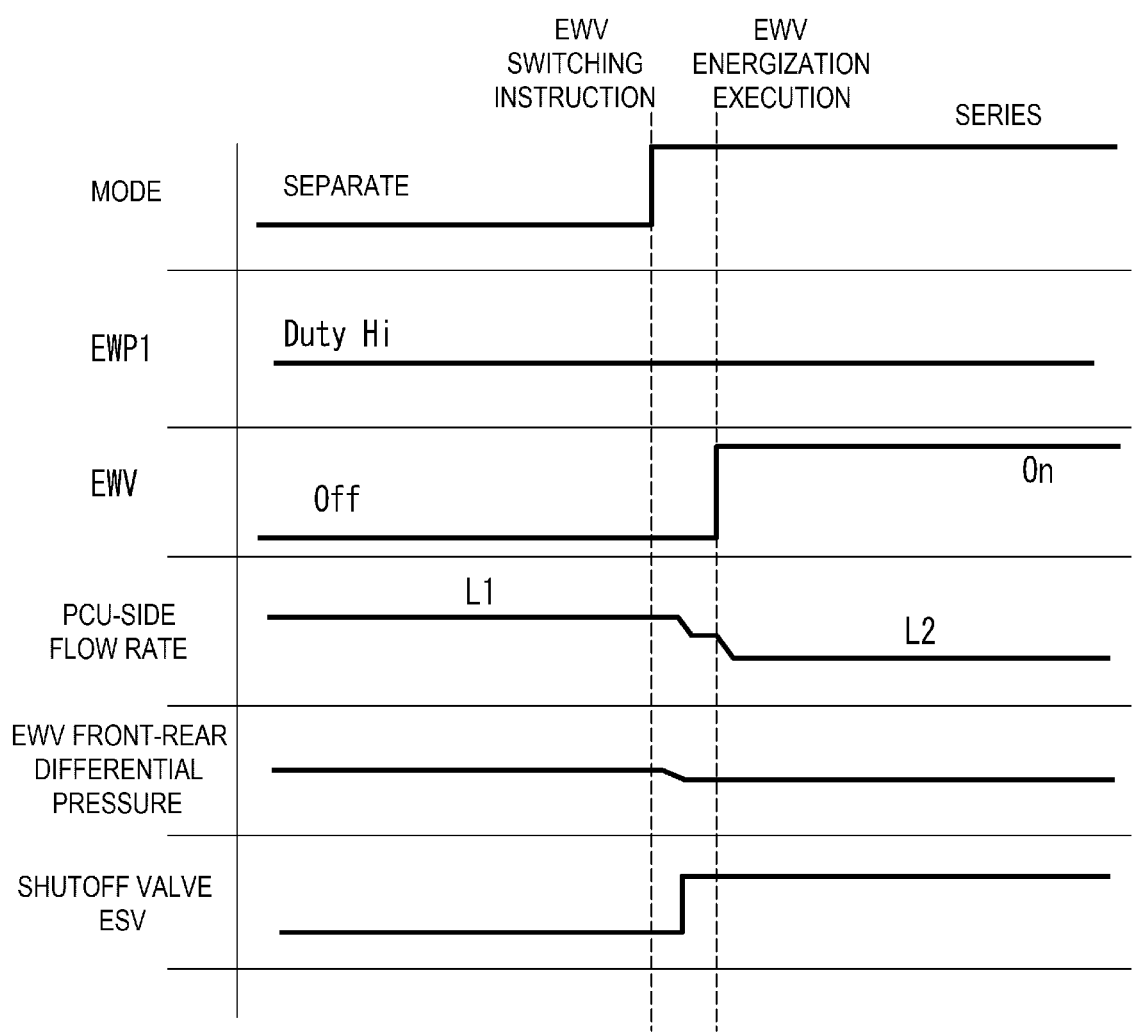
FIG. 12 is a timing chart showing operation of the temperature adjustment circuit of FIG. 9.

As shown in FIG. 9, the temperature adjustment circuit 1B of the second embodiment is different from the temperature adjustment circuit 1 of the first embodiment in further including: a second branch path 22 that bypasses the electromagnetic switching valve EWV and connects the first temperature adjustment circuit 4 and the second temperature adjustment circuit 6 in the coupled circuit 7; and an electromagnetic shutoff valve ESV that is disposed in the second branch path 22 and switches opening and closing of the second branch path 22.

When the control device 10 of the second embodiment switches the temperature adjustment circuit 1B from the separate mode to the series mode, the control device 10 controls the electromagnetic shutoff valve ESV from the closed state to the open state without decreasing the rotation speed of the first pump EWP1. When the electromagnetic cutoff valve ESV is in the open state, a part of the heat medium flowing through the electromagnetic switching valve EWV flows into the second branch path 22, and the heat medium flowing through the electromagnetic switching valve EWV decreases.

According to the temperature adjustment circuit 1B of the second embodiment, it is possible to prevent the thrust required for operation of the movable portion of the electromagnetic switching valve EWV from increasing without decreasing the rotation speed of the first pump EWP1. Therefore, it is possible to prevent the flow rate of the heat medium flowing through the temperature adjustment circuit 1B from decreasing as compared to a case in which the rotation speed of the first pump is decreased, and as a result, deterioration of heat radiation performance caused by decrease in the flow rate of the heat medium can be avoided.

[Vehicle]

Figure 13:
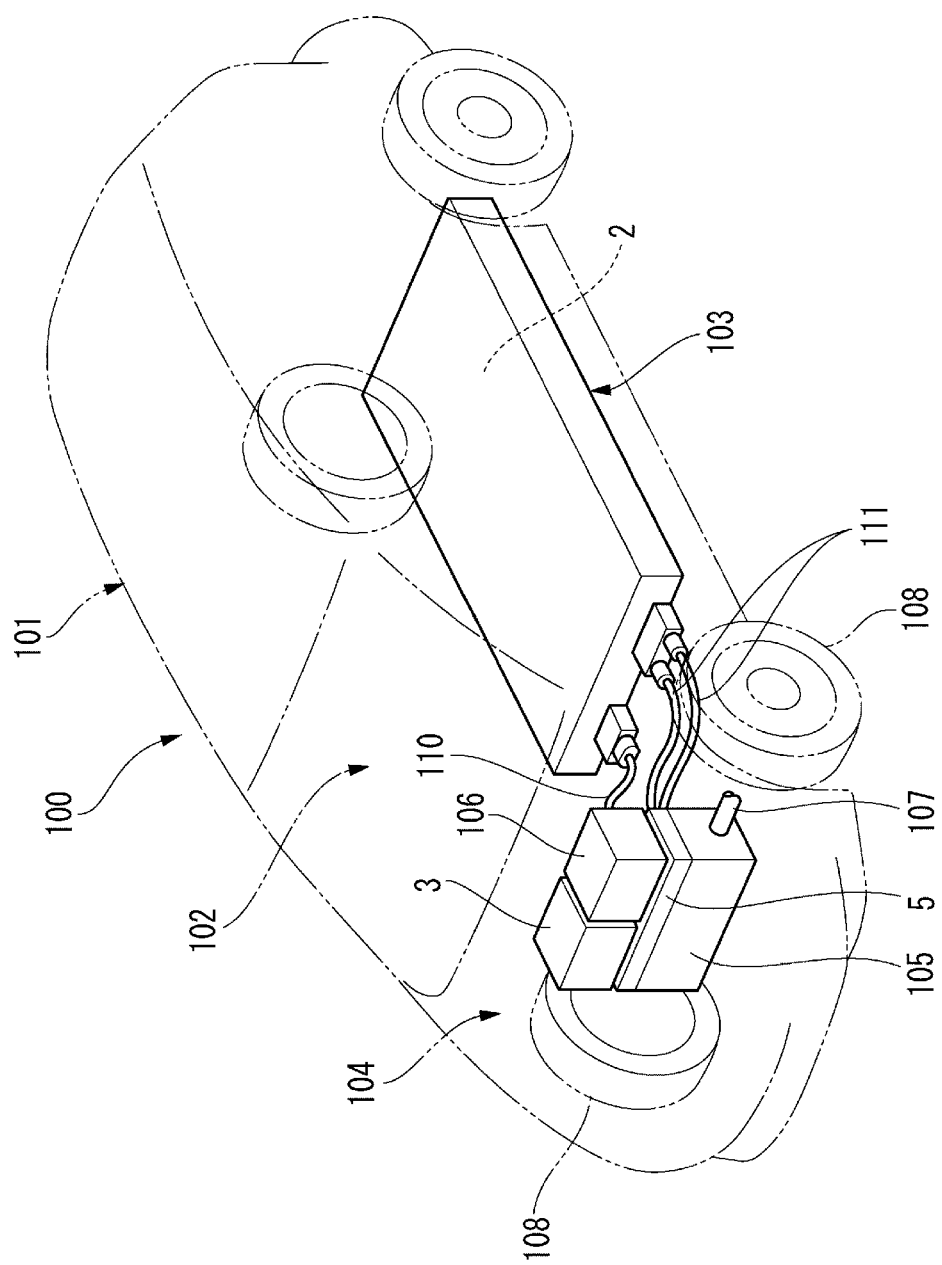
FIG. 13 is a perspective view showing a schematic configuration of an electric vehicle in which the temperature adjustment circuits of the first and second embodiments can be used.

FIG. 13 is a perspective view showing a schematic configuration of an electric vehicle 100 in which the temperature adjustment circuits 1, 1B of the first and second embodiments can be used. The electric vehicle 100 may be an electric vehicle or a fuel cell vehicle having only an electric motor as a drive source, and may be a hybrid vehicle having an electric motor and an internal combustion engine, whereas in the following description, an electric vehicle will be described as an example.

A vehicle body 101 of the electric vehicle 100 is equipped with a battery case 103 that houses the battery 2 in an underfloor portion of a cabin 102. A motor room 104 is provided in a front portion of the electric vehicle 100. The motor 105, the power conversion device 5, a branch unit 106, the charger 3, and the like are provided in the motor room 104.

A rotational driving force of the motor 105 is transmitted to a shaft 107. Front wheels 108 of the electric vehicle 100 are respectively connected to both end portions of the shaft 107. The power conversion device 5 is disposed on an upper side of the motor 105 and is directly fastened and fixed to a case of the motor 105. The power conversion device 5 is electrically connected to a connector of the battery case 103 via a power cable 111. The power conversion device 5 is electrically connected to the motor 105 via, for example, a three-phase bus bar. The power conversion device 5 controls driving of the motor 105 via electric power supplied from the battery 2.

The branch unit 106 and the charger 3 are arranged in parallel in a left-right direction. The branch unit 106 and the charger 3 are arranged above the power conversion device 5. The branch unit 106 and the charger 3 are arranged apart from the power conversion device 5. The branch unit 106 and the battery case 103 are electrically connected to each other via a cable 110 having connectors at both ends thereof.

The branch unit 106 is electrically connected to the charger 3. The charger 3 is connected to a general external power supply such as a household power supply, so as to charge the battery 2. The charger 3 and the branch unit 106 are electrically connected to each other via a cable (not shown) having connectors at both ends thereof.

The above embodiment may be appropriately modified, improved, or the like. For example, in the above-described embodiment, the power conversion device 5 that supplies electric power to the motor is cooled by the second temperature adjustment circuit 6, whereas the motor 105 may be cooled by the second temperature adjustment circuit 6, and the motor 105 and the power conversion device 5 may be cooled by the second temperature adjustment circuit 6.

At least the following matters are described in the present specification. Corresponding components in the above-described embodiments are shown in parentheses, without being limited thereto.

(1) A temperature adjustment circuit (the temperature adjustment circuit 1) which includes:
a first temperature adjustment circuit (the first temperature adjustment circuit 4) configured to exchange heat with a battery (the battery 2);
a second temperature adjustment circuit (the second temperature adjustment circuit 6) configured to exchange heat with at least one of a motor (the motor 105) and a power conversion device (the power conversion device 5) that supplies electric power to the motor;
a first pump (the first pump EWP1) configured to circulate a heat medium in at least one of the first temperature adjustment circuit and the second temperature adjustment circuit;
a coupling path (the first coupling path 8, the second coupling path 9) that couples the first temperature adjustment circuit and the second temperature adjustment circuit to form a coupled circuit (the coupling path 7);
a switching unit (the electromagnetic switching valve EWV) capable of switching between a circulation state in which the heat medium circulates in the coupled circuit and a non-circulation state in which the heat medium does not circulate in the coupled circuit; and
a control device (the control device 10) configured to control the switching unit and the first pump,
in which when the control device switches the coupled circuit from the non-circulation state to the circulation state, the control device performs switching of the switching unit in a state in which a rotation speed of the first pump is decreased lower than a rotation speed of the first pump before switching, and increases the rotation speed of the first pump after switching.

According to (1), when the control device switched the coupled circuit from the non-circulation state to the circulation state, the control device performs switching in a state in which a rotation speed of the first pump is decreased lower than a rotation speed of the first pump before switching, and increases the rotation speed of the first pump after switching. Thereby, it is possible to prevent a thrust required for operation of a movable portion of the switching unit from increasing, and to prevent increase in size or increase in manufacturing cost of the switching unit. Further, by preventing a thrust required for operation of the movable portion of the switching unit from increasing, it is possible to not only prevent occurrence of collision noise in the movable portion, but also prevent occurrence of excessive pressure pulsation in a cooling pipe, thereby ensuring excellent silence.

(2) In the temperature adjustment circuit according to (1), the temperature adjustment circuit further includes:
a heat exchanger (the radiator 12) disposed in at least one of the first temperature adjustment circuit and the second temperature adjustment circuit; and
a fan (the fan 12a) configured to blow air to the heat exchanger, and
when the control device switches the coupled circuit from the non-circulation state to the circulation state, the control device increases an air volume of the fan.

According to (2), since the control device increases the air volume of the fan blown to the heat exchanger when the control device switches the coupled circuit from the non-circulation state to the circulation state, the air volume of the fan blown to the heat exchanger is increased as well when a flow rate of the heat medium decreases, and thus it is possible to prevent decrease in heat radiation performance.

(3) In the temperature adjustment circuit according to (1) or (2), the temperature adjustment circuit further includes:
a branch path (the branch path 16) configured to bypass a part of the coupled circuit; and
an open-close valve (the electromagnetic open-close valve FSV) configured to switch opening and closing of the branch path, and
after the control device controls the open-close valve from an open state to a closed state, the control device switches the coupled circuit from the non-circulation state to the circulation state.

According to (3), after the control device controls the open-close valve of the branch path from the open state to the closed state, the control device switches the coupled circuit from the non-circulation state to the circulation state, and thus it is possible to stably perform switching of the circuit.

(4) In the temperature adjustment circuit according to any one of (1) to (3), the first pump is disposed in the second temperature adjustment circuit.

According to (4), at least one of the motor and the power conversion device, which have a high frequency of use, can be subjected to temperature adjustment constantly.

(5) In the temperature adjustment circuit according to (4), the temperature adjustment circuit further includes:
a branch path (the branch path 16) configured to bypass a part of the coupled circuit;
an open-close valve (the electromagnetic open-close valve FSV) configured to switch opening and closing of the branch path; and
a second pump (the second pump EWP2) disposed in the first temperature adjustment circuit, and
the second pump is disposed in the branch path.

According to (5), the open-close valve and the second pump can be arranged in the branch path in an aggregated manner.

(6) A control method for a temperature adjustment circuit (the temperature adjustment circuit 1), which includes:

a first temperature adjustment circuit (the first temperature adjustment circuit 4) configured to exchange heat with a battery (the battery 2);
a second temperature adjustment circuit (the second temperature adjustment circuit 6) configured to exchange heat with at least one of a motor (the motor 105) and a power conversion device (the power conversion device 5) that supplies electric power to the motor;
a first pump (the first pump EWP1) configured to circulate a heat medium in at least one of the first temperature adjustment circuit and the second temperature adjustment circuit;
a coupling path (the first coupling path 8, the second coupling path 9) that couples the first temperature adjustment circuit and the second temperature adjustment circuit to form a coupled circuit (the coupling path 7); and
a switching unit (the electromagnetic switching valve EWV) capable of switching between a circulation state in which the heat medium circulates in the coupled circuit and a non-circulation state in which the heat medium does not circulate in the coupled circuit,
in which the control method includes:
when the coupled circuit is switched from the non-circulation state to the circulation state,
performing switching of the switching unit in a state in which a rotation speed of the first pump is decreased lower than a rotation speed of the first pump before switching; and
increasing the rotation speed of the first pump after switching.

According to (6), when the coupled circuit is switched from the non-circulation state to the circulation state, switching is performed in a state in which a rotation speed of the first pump is decreased lower than a rotation speed of the first pump before switching, and the rotation speed of the first pump is increased after switching. Thereby, it is possible to prevent a thrust required for operation of a movable portion of the switching unit from increasing, and to prevent increase in size or increase in manufacturing cost of the switching unit.

(7) In the control method for the temperature adjustment circuit according to (6), the temperature adjustment circuit further includes:
a heat exchanger (the radiator 12) disposed in at least one of the first temperature adjustment circuit and the second temperature adjustment circuit; and
a fan (the fan 12*a*) configured to blow air to the heat exchanger, and
the control method further includes:
increasing an air volume of the fan when the coupled circuit is switched from the non-circulation state to the circulation state.

According to (7), since the air volume of the fan blown to the heat exchanger is increased when the coupled circuit is switched from the non-circulation state to the circulation state, the air volume of the fan blown to the heat exchanger is increased as well when a flow rate of the heat medium decreases, and thus it is possible to prevent decrease in heat radiation performance.

(8) In the control method for the temperature adjustment circuit according to (6) or (7), the temperature adjustment circuit further includes:
a branch path (the branch path 16) configured to bypass a part of the coupled circuit; and
an open-close valve (the electromagnetic open-close valve FSV) configured to switch opening and closing of the branch path, and
the control method further includes:
controlling the open-close valve from an open state to a closed state, and
the coupled circuit is switched from the non-circulation state to the circulation state after the open-close valve is controlled from the open state to the closed state.

According to (8), after the open-close valve of the branch path is controlled from the open state to the closed state, the coupled circuit is switched from the non-circulation state to the circulation state, and thus it is possible to stably perform switching of the circuit.

(9) A temperature adjustment circuit (the temperature adjustment circuit 1B) which includes:

a first temperature adjustment circuit (the first temperature adjustment circuit 4) configured to exchange heat with a battery (the battery 2);
a second temperature adjustment circuit (the second temperature adjustment circuit 6) configured to exchange heat with at least one of a motor (the motor 105) and a power conversion device (the power conversion device 5) that supplies electric power to the motor;
a pump (the first pump EWP1) configured to circulate a heat medium in at least one of the first temperature adjustment circuit and the second temperature adjustment circuit;

a coupling path (the first coupling path 8, the second coupling path 9) that couples the first temperature adjustment circuit and the second temperature adjustment circuit to form a coupled circuit (the coupling path 7);

a switching unit (the electromagnetic switching valve EWV) capable of switching between a circulation state in which the heat medium circulates in the coupled circuit and a non-circulation state in which the heat medium does not circulate in the coupled circuit; and a control device (the control device 10) configured to control the switching unit and the pump, in which the temperature adjustment circuit further includes:

a branch path (the second branch path 22) configured to bypass the switching unit and connect the first temperature adjustment circuit and the second temperature adjustment circuit; and an electromagnetic valve (the electromagnetic shutoff valve ESV) disposed in the branch path and configured to switch opening and closing of the branch path, and in which when the control device switches the coupled circuit from the non-circulation state to the circulation state, the control device controls the electromagnetic valve from a closed state to an open state.

According to (9), when the control device switched the coupled circuit from the non-circulation state to the circulation state, the control device controls the electromagnetic valve from the closed state to the open state. Therefore, even if the rotation speed of the pump is decreased, it is possible to prevent a thrust required for operation of a movable portion of the switching unit from increasing, and to prevent increase in size or increase in manufacturing cost of the switching unit.

The invention claimed is:

1. A temperature adjustment circuit comprising:
   a first temperature adjustment circuit configured to exchange heat with a battery;
   a second temperature adjustment circuit configured to exchange heat with at least one of a motor and a power conversion device that supplies electric power to the motor;
   a first pump configured to circulate a heat medium in at least one of the first temperature adjustment circuit and the second temperature adjustment circuit;
   a coupling path that couples the first temperature adjustment circuit and the second temperature adjustment circuit to form a coupled circuit;
   a switching unit capable of switching between a circulation state in which the heat medium circulates in the coupled circuit and a non-circulation state in which the heat medium does not circulate in the coupled circuit;
   a control device configured to control the switching unit and the first pump;
   a branch path configured to bypass a part of the coupled circuit; and
   an open-close valve configured to switch opening and closing of the branch path,
   wherein the branch path is configured to bypass the switching unit and connect the first temperature adjustment circuit and the second temperature adjustment circuit,
   wherein when the control device switches the coupled circuit from the non-circulation state to the circulation state, the control device performs switching of the switching unit in a state in which a rotation speed of the first pump is decreased lower than a rotation speed of the first pump before switching, and increases the rotation speed of the first pump after switching, and
   wherein after the control device controls the open-close valve from an open state to a closed state, the control device switches the coupled circuit from the non-circulation state to the circulation state.

2. The temperature adjustment circuit according to claim 1,
   wherein the temperature adjustment circuit further comprises:
   a heat exchanger disposed in at least one of the first temperature adjustment circuit and the second temperature adjustment circuit; and
   a fan configured to blow air to the heat exchanger, and
   wherein when the control device switches the coupled circuit from the non-circulation state to the circulation state, the control device increases an air volume of the fan.

3. The temperature adjustment circuit according to claim 1,
   wherein the first pump is disposed in the second temperature adjustment circuit.

4. The temperature adjustment circuit according to claim 3,
   wherein the temperature adjustment circuit further comprises:
   a second pump disposed in the first temperature adjustment circuit, and
   wherein the second pump is disposed in the branch path.

5. A control method for a temperature adjustment circuit comprising:
   a first temperature adjustment circuit configured to exchange heat with a battery;
   a second temperature adjustment circuit configured to exchange heat with at least one of a motor and a power conversion device that supplies electric power to the motor;
   a first pump configured to circulate a heat medium in at least one of the first temperature adjustment circuit and the second temperature adjustment circuit;
   a coupling path that couples the first temperature adjustment circuit and the second temperature adjustment circuit to form a coupled circuit; and
   a switching unit capable of switching between a circulation state in which the heat medium circulates in the coupled circuit and a non-circulation state in which the heat medium does not circulate in the coupled circuit,
   wherein the control method comprises:
   when the coupled circuit is switched from the non-circulation state to the circulation state, performing switching of the switching unit in a state in which a rotation speed of the first pump is decreased lower than a rotation speed of the first pump before switching; and
   increasing the rotation speed of the first pump after switching.

6. The control method for the temperature adjustment circuit according to claim 5,
   wherein the temperature adjustment circuit further comprises:
   a heat exchanger disposed in at least one of the first temperature adjustment circuit and the second temperature adjustment circuit; and
   a fan configured to blow air to the heat exchanger, and
   wherein the control method further comprises:

increasing an air volume of the fan when the coupled circuit is switched from the non-circulation state to the circulation state.

7. The control method for the temperature adjustment circuit according to claim 5,
wherein the temperature adjustment circuit further comprises:
a branch path configured to bypass a part of the coupled circuit; and
an open-close valve configured to switch opening and closing of the branch path,
wherein the control method further comprises:
controlling the open-close valve from an open state to a closed state, and
wherein the coupled circuit is switched from the non-circulation state to the circulation state after the open-close valve is controlled from the open state to the closed state.

8. A temperature adjustment circuit comprising:
a first temperature adjustment circuit configured to exchange heat with a battery;
a second temperature adjustment circuit configured to exchange heat with at least one of a motor and a power conversion device that supplies electric power to the motor;
a pump configured to circulate a heat medium in at least one of the first temperature adjustment circuit and the second temperature adjustment circuit;
a coupling path that couples the first temperature adjustment circuit and the second temperature adjustment circuit to form a coupled circuit;
a switching unit capable of switching between a circulation state in which the heat medium circulates in the coupled circuit and a non-circulation state in which the heat medium does not circulate in the coupled circuit; and
a control device configured to control the switching unit and the pump,
wherein the temperature adjustment circuit further comprises:
a branch path configured to bypass the switching unit and connect the first temperature adjustment circuit and the second temperature adjustment circuit; and
an electromagnetic valve disposed in the branch path and configured to switch opening and closing of the branch path, and
wherein when the control device switches the coupled circuit from the non-circulation state to the circulation state, the control device controls the electromagnetic valve from a closed state to an open state.

* * * * *